(12) United States Patent
Shimizu et al.

(10) Patent No.: US 7,030,360 B2
(45) Date of Patent: Apr. 18, 2006

(54) PHOTORECEPTOR

(75) Inventors: Takayuki Shimizu, Osaka (JP); Takeshi Murata, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 96 days.

(21) Appl. No.: 10/735,914

(22) Filed: Dec. 16, 2003

(65) Prior Publication Data
US 2004/0173729 A1    Sep. 9, 2004

(30) Foreign Application Priority Data
Mar. 5, 2003 (JP) .............................. 2003-058095

(51) Int. Cl.
*H01J 40/14* (2006.01)
(52) U.S. Cl. .............................................. 250/214 RC
(58) Field of Classification Search ................ 250/221, 250/214 R, 214 RC, 214 C
See application file for complete search history.

(56) References Cited
FOREIGN PATENT DOCUMENTS
JP        3018541        1/2000

*Primary Examiner*—David Porta
*Assistant Examiner*—Tony Ko
(74) *Attorney, Agent, or Firm*—Nixon & Vanderhye, P.C.

(57) ABSTRACT

A photoreceptor is provided with an erroneous operation detection circuit for monitoring an output signal supplied from a slew rate variable output stage. The erroneous operation detection circuit performs such controls that a slew rate of output is decreased within a range in which a transmission speed of the slew rate variable output stage is not decreased. With this arrangement, it is possible to inhibit adverse effect on the output signal due to a parasite current caused between an output terminal of the photoreceptor and photoelectric converting means, such as a photodiode.

12 Claims, 13 Drawing Sheets

IN CASE THERE IS NO
ERRONEOUS OPERATION IN
OUTPUT

OUTPUT WAVEFORM

OUTPUT WAVEFORM OF
CHARGING AND
DISCHARGING CIRCUIT

OUTPUT WAVEFORM OF
INTEGRATING CIRCUIT

IN CASE THERE IS
ERRONEOUS OPERATION IN
OUTPUT

OUTPUT WAVEFORM

OUTPUT WAVEFORM OF
CHARGING AND
DISCHARGING CIRCUIT

OUTPUT WAVEFORM OF
INTEGRATING CIRCUIT

IN CASE THERE IS NO
ERRONEOUS OPERATION IN
OUTPUT

OUTPUT WAVEFORM

OUTPUT WAVEFORM OF
CHARGING AND
DISCHARGING CIRCUIT

OUTPUT WAVEFORM OF
INTEGRATING CIRCUIT

IN CASE THERE IS
ERRONEOUS OPERATION IN
OUTPUT

OUTPUT WAVEFORM

OUTPUT WAVEFORM OF
CHARGING AND
DISCHARGING CIRCUIT

OUTPUT WAVEFORM OF
INTEGRATING CIRCUIT

OUTPUT WAVEFORM

WAVEFORM OF PARASITE CURRENT

PHOTORECEPTOR

This application claims priority to Japan Application No. 2003-058095, filed 05 Mar. 2003. The entire contents of this application are incorporated herein by reference.

FIELD OF THE INVENTION

The present invention relates to a photoreceptor for converting an optical signal into a digital electric signal and outputting the digital electric signal, the photoreceptor being for use in a digital audio device and the like linked (connected) with an optical fiber link, for example. Especially, the present invention relates to a photoreceptor provided with an optical electronic integrated circuit called OEIC (Optoelectronic IC) in which a photo acceptance unit and a signal processing circuit are integrated in a single chip.

BACKGROUND OF THE INVENTION

FIG. 11 is a block diagram schematically illustrating a typical conventional photoreceptor for an optical fiber, for use in digital audio device. The photoreceptor is provided with a photodiode PD11 for receiving an optical signal transmitted via the optical fiber, and a signal processing circuit for performing signal processing in accordance with output from the photodiode PD11. The photodiode PD11 generates an electronic signal that is in proportion with intensity of the optical signal. A photocurrent detected by the photodiode PD11 is linearly converted into a voltage by a current-to-voltage conversion amplifier including an amplifier AMP 11, a resistor Rf11, and a capacitor Cf11. A bypass filter including a capacitor C11 and a resistor R11 removes a low frequency component from the voltage that has been converted from the photocurrent. Then, a constant voltage source Vref gives an operating point is given to the voltage. After that, the voltage is supplied to an amplifier circuit AMP13.

Moreover, a capacitor Cpd11 having the same capacitance as a parasite capacitance caused between the photodiode PD11 and GND is connected to an current-to-voltage converting amplifier including an amplifier AMP 12, a resistor Rf12, and a capacitor Cf12. A current supplied from the capacitance Cf12 is converted into a voltage by the current-to-voltage converting amplifier. Further, a bypass filter including the capacitor C12 and a resistor 12 removes a low frequency component from the voltage that has been converted from the current supplied from the capacitance Cf12. Then, the constant voltage source Vref gives an operating point to the voltage. The voltage is supplied to the amplifier circuit AMP13 so that the voltage is differential with respect to output of the amplifier AMP11.

With this circuit configuration, a common-mode noise component such as power source line noise and the like, is removed by a differential circuit.

The output of the amplifier circuit AMP 13 is supplied to a hysteresis comparator COMP 11 so that a waveform of the output is shaped. Then, an output stage 11 converts the output into a high-low digital signal, and outputs the high-low digital signal. The output stage 11 is composed of an inverter provided with an Nch (N channel) MOS (Metal Oxide Semiconductor) transistor MN11 and a Pch (P channel) MOS transistor MP11.

The photodiode PD11 and the signal processing circuit is integrated in a single chip. The photoreceptor integrated in a single chip is bonded on a wire frame by using a conductive adhesive material such as a silver paste, and wire-bonded with gold wires, so that a power source line and an output terminal are connected to terminals of the wire frame. Then, a lens is formed from a transparent mold resin, so as to be located on the photodiode PD11, whereby the photodiode PD11 and the lens are integrally structured.

In the photoreceptor that performs such digital output, as shown in FIG. 12, a parasite current of the photodiode flows in synchronism with rise and fall of the output, due to capacitive coupling between a wire connected to the output terminal, and the photodiode. The parasite current causes erroneous operation, thereby deteriorating sensitivity in receiving the optical signal.

There is a case the integration of the photodiode and the signal processing circuit in a single chip results in a larger parasite capacitance between the photodiode and the output terminal, compared with a photoreceptor including a photodiode and a signal processing circuit, which are formed in separate chips. More specifically, when the configuration in which a photoreceptor includes a photodiode and a signal processing circuit formed in separate chips, is compared with the configuration in which a photoreceptor includes the photodiode and the signal processing circuit integrated in a single chip, the output terminal and the photodiode are located closer to each other in the latter configuration. Thus, the latter configuration has a larger parasite capacitance between the output terminal and the photodiode. This is because the parasite capacitance is in inverse proportion with a distance between two neighboring conductive elements where the two neighboring conductive elements have the same area.

In order to solve this, contrived is a configuration in which a dummy photodiode is provided instead of the capacitor Cpd11, the dummy photodiode having the same area as the photodiode. The dummy photodiode has substantially the same area as the photodiode. A wire for cathode potential covers the dummy photodiode from light. Thus, even if an optical signal is introduced into the dummy photodiode, no current signal is outputted from the dummy photodiode. In this configuration, the parasite current from the output terminal can flow into the dummy photodiode and the photodiode evenly. In this case, a common-mode signal component is removed by the differential amplifier. This reduces erroneous operation.

However, in case where the dummy photodiode having the same area as the photodiode in the same chip in which the photodiode and the signal processing circuit are provided, a photodiode area (area that the dummy photodiode and the photodiode occupy) is doubled, thereby increasing chip area. It is a problem that this is disadvantageous in terms of cost. This problem is significant especially in a photo acceptance IC for digital audio optical fiber having a larger photodiode area than photo acceptance IC for photocoupler and optical disc.

Moreover, even in the configuration in which the dummy photodiode and the photodiode have the same area, there are some cases that the dummy photodiode and the photodiode have different parasite capacitances due to (i) difference in how the gold wire is extended from the output terminal, (ii) difference in location of the dummy photodiode and the photodiode, and (iii) other differences. In other words, if the parasite capacitance caused between the output terminal and the dummy photodiode becomes imbalanced with the parasite capacitance caused between the output terminal and the photodiode because of the difference in how the gold wire is extended from the output terminal, and the difference in the location of the dummy photodiode and the photodiode, this imbalance causes erroneous operation, too.

On the other hand, it may be arranged such that a transparent conductive film such as an ITO (Indium Tin Oxide) film is so provided on the photodiode as to cover the photodiode, the transparent conductive film being connected to a GND potential associated with a PD11 (that is, associated with the portion of the circuit for receiving the optical signal). In this arrangement, a noise current caused by a capacitance caused between input terminal and output terminal flows into the GND by the transparent conductive film. Thus, only an optical signal from the photodiode is outputted. This prevents erroneous operation caused by noises. However, it is necessary to have an apparatus specially for covering the photodiode with the ITO film. This complicates manufacturing process of the photoreceptor. Moreover, the large parasite capacitance caused between the ITO film and the photodiode lowers band of an amplifier of the receptor and increase noises, thereby retarding high speed communication.

Next, a current to be fed back from the output terminal to the photodiode is discussed below. The current Ip to be fed back form the output terminal to the photodiode is given by the following equation:

$$Ip = Cp \cdot (dV/dt) \quad (1),$$

where Cp is the parasite capacitance caused between the output terminal and the photodiode, and (dV/dt) is a slew rate of the rise or the fall of the output voltage.

At time t, the rise of output voltage has a waveform given by the following equation:

$$V = Vo(1 - \exp((t/Rout \cdot Cout)))) \quad (2),$$

where Rout is an output resistance of an output stage, Cout is a capacitance of the output stage, and Vo is a amplitude of the output voltage.

Because the output stage has a cutoff frequency fo=1/(2π·Rout·Cout), Equation (2) is:

$$V = Vo(1 - \exp(-2\pi \cdot fo \cdot f)) \quad (3).$$

Thus, the slew rate (dV/dt) of the output can be represented by the following equation:

$$(dV/dt) = Vo \cdot 2\pi \cdot fo \cdot \exp(-2\pi \cdot fo \cdot t) \quad (4).$$

Therefore, by substitution of Equation (4) in Equation (1), the current Ip to be fed back from the output terminal to the photodiode at the rise of the output is:

$$Ip = Cp \cdot Vo \cdot 2\pi \cdot fo \cdot \exp(-2\pi \cdot fo \cdot t) \quad (5).$$

FIG. 13(a) illustrates an output waveform worked out by Equation (5) with an assumption that the parasite capacitance Cp between the output terminal and the photodiode is 10 fF, rise time tr in which an output amplitude of the output is increased from 10% to 90% is 10 ns, and the output amplitude Vo is 3V.

fo=0.35/tr, where the output starts to rise when t=0. Thus, from Equation (5), the parasite current Ip caused at the rise of the output at time t is:

$$Ip = (10 \text{ fF}) \cdot (3V) \cdot 2\pi \cdot (0.35/10 \text{ ns}) \cdot \exp(-2\pi \cdot (0.35/10 \text{ ns}) \cdot \quad (6).$$

The fall of the output causes a parasite current that is identical in size but opposite in a flow direction with respect to the parasite current Ip caused at the rise of the output. From Equation (6), Ip has its peak when t=0.

The parasite pulse caused by the parasite capacitance caused between the output terminal and the photodiode has a parasite current waveform as shown in FIG. 13(b), for example. Let t=0 in Equation (6), then the peak of Ip is:

$$Ip = (10 \text{ fF}) \cdot (3V) \cdot 2\pi \cdot (0.35/10 \text{ ns}) = 6.6 \text{ } \mu A \quad (7).$$

That is, a peak current is 6.6 μA.

An optical signal for digital audio device is transmitted at 5.6448 Mbps in case of equi-speed, at 11.2896 Mbps in case of double speed, and at 22.5792 Mbps in case of four-time speed. For transmitting such signal, the acceptance circuit needs to have a wider band of amplifier for the transmission carried out at a faster speed. An effect of the parasite current pulse is larger in case the amplifier has a wider band.

The following explains the band of the amplifier. Generally, a gain of the amplifier has such a frequency characteristics that the gain of the amplifier is lower at a higher frequency. A frequency at which the gain of the amplifier changes to a gain of −3 dB is called as a cut-off frequency (fc). Generally, the band of the amplifier refers to the cut-off frequency. That is, it is necessary to increase a frequency of a signal for transmitting the signal at a higher speed, and it is necessary to increase the band of the amplifier in order to sufficiently amplify the signal.

Note that all of the parasite current obtained from Equation (6) does not get amplified thereby causing no erroneous operation, because the waveform of the parasite current includes a high frequency component. If the bond of the amplifier of the photoreceptor is set to be 0.8 times of the transmission speed (Mbps), the band of the amplifier is 4.5 MHz in case of equi-speed, 9 MHz in case of double speed, and 18 MHz in case of four-time speed. If a pulse waveform of the parasite photocurrent given by Equation (6) is passed through low-pass filters respectively having cut-off frequencies of 4.5 MHz, 9 MHz, and 18 MHz, circuit simulation shows that peak currents are 0.627 μA, 1.602 μA, and 1.686 μA. These currents are amplified and causes the erroneous operation.

The receptor for the digital audio device linked with an optical fiber has a minimum reception sensitivity in a range of from −27 dBm to −24 dBm. At the minimum reception sensitivity, a photodiode current that flows in accordance with a signal is approximately 0.5 μA to 1 μA. That is, the effect of the parasite current between the output terminal and the photodiode is not negligibly small.

Moreover, if the band of the amplifier is wider, a signal of a higher frequency component can be amplified. Thus, if the band of the amplifier is wider, the high-frequency peak current of the parasite current is amplified. In other words, because a wider band of the amplifier causes a larger parasite current, the parasite current pulse causes erroneous operation more often in the receptor having a higher transmission speed.

On the other hand, when the power source voltage is increased, an ON-resistance of the inverter including the Nch MOS transistor and Pch MOS transistor in the output stage 11 is decreased thereby decreasing output resistance. The following explains this.

A drain current ID of the MOS transistor is given by:

$$ID = K(Vgs - Vt)2(1 + \lambda Vds) \quad (8),$$

where K is transconductance coefficient, Vt is a threshold voltage, Vgs is a gate-source voltage, Vds is a drain-source voltage, and λ is a channel length modulation coefficient.

In case of the output stage is structured by forming an inverter including the Nch MOS transistor and the Pch MOS transistor, Vgs=Vds=Vcc (power source voltage). Thus, the drain current is given by:

$$ID = K(Vcc-Vt)2(1+\lambda Vcc) \quad (9).$$

Accordingly, a resistance R of the MOS transistors, which is represented as Vcc/ID, is given by:

$$R = Vcc/ID = Vcc/(K(Vcc-Vt)2(1+\lambda Vcc)) \quad (10).$$

Equation 10 shows that the increase in power source voltage decreases the output resistance R.

As described above, the increase in the power source voltage decreases the output resistance of the output stage 11, whereby the rise time tr and the fall time tf become earlier and output amplification is enlarged. Thus, the value of (dV/dt) in the parasite current I=C×(dV/dt) is increased. As a result, possibility of the erroneous operation is increased. Moreover, even if it is adjusted such that the erroneous operation will not occur at a power source voltage of 3V, periods of tr and tf are shortened at the power source voltage of 5V. This results in an increase in the output amplitude that leads to a large parasite current. As a result, the erroneous operation occurs. Moreover, if tr and tf are adjusted such that the erroneous operation will not occur at a power source voltage of 5V, tr and tf are delayed when the power source voltage becomes 3V. This limits a transmission speed at which the signal can be transmitted. This makes it difficult to realize a high-speed digital output receptor having a wide range of operational power source voltage.

Moreover, Publication of Japanese Patent No. 3018541 (published on Mar. 13, 2000) discloses an output circuit whose slew rate of an output is two-stage switched ON in accordance with a slew rate control signal supplied from outside. This output circuit is incapable of performing a fine control of the slew rate within a range in which the erroneous operation can be inhibited, because the control of the slew rate of the output is only two-staged.

SUMMARY OF THE INVENTION

The present invention, which is contrived to solve the aforementioned problems, has an object to provide a photoreceptor, which converts an optical signal into an electric signal and outputs the electric signal, the photoreceptor being arranged to be capable of inhibiting adverse effect on the electric signal thus outputted, the adverse effect being due to a parasite current caused between an output terminal of the photoreceptor and a photoelectric converting section such as a photodiode.

In order to attain the object, a photoreceptor of the present invention is provided with a photoelectric converting section for receiving an optical signal and converting the optical signal into an electric signal; an output section for outputting a digital signal in accordance with the electric signal; and an erroneous operation detection section for monitoring the digital signal thus outputted from the output section, so as to detect erroneous operation, the output section including output slew rate changing section for changing a slew rate of output of the output section, and the erroneous operation detection section performing, when the erroneous operation detection section detects the erroneous operation, such control that a transmission speed of the output slew rate changing section is decreased.

In this arrangement, the optical signal thus received by the photoelectric converting section is converted into the electric signal, and the electric signal is outputted from the output section as the digital signal. In this arrangement, there is a possibility that a parasite capacitance occurs between the photoelectric converting section and the output section in case where a distance therebetween is relatively short. The parasite capacitance causes a parasite current. If such parasite current is superimposed on the electric signal thus outputted, it becomes impossible to perform normal output of the digital signal, thus resulting in occurrence of jitter.

According to the above arrangement, on the other hand, when the erroneous operation detection section detects erroneous operation in the signal outputted from the output section, the erroneous operation detection section performs such control that the slew rate of the output of the output slew rate changing section is decreased.

When the slew rate of the output is decreased, the parasite current between the output terminal and the photodiode is decreased as described above. Thus, it is possible to reduce jitter and erroneous operation in the signal outputted.

Furthermore, according to the above arrangement, the slew rate of the output can be decreased within a range in which the signal can be transmitted. Therefore, the erroneous operation can be inhibited as much as possible. On the other hand, according to the output circuit of Publication of Japanese Patent No. 3018541, the control of the slew rate of the output in accordance with the control signal supplied from outside is only two-staged Moreover, a photoreceptor of the present invention is provided with: a photoelectric converting section for receiving an optical signal and converting the optical signal into an electric signal; an output section for outputting a digital signal in accordance with the electric signal; and a power source voltage detection section for detecting a voltage value of a power source voltage supplied to the output section, the output section including output slew rate changing section for changing a slew rate of output of the output section, and the power source voltage detection section controlling the slew rate of the output of the output slew rate changing section in accordance with a change in the power source voltage.

In the above arrangement, the optical signal received by the photoelectric converting section is converted into the electric signal. Then, the electric signal is outputted from the output section as the digital signal. In this arrangement, the change in the voltage value of the power source voltage supplied to the output section changes an output resistance of the output section, as described above, whereby an effect of the parasite current becomes larger. If such parasite current is superimposed on the electric signal thus outputted, it becomes impossible to perform normal output of the digital signal, thus resulting in occurrence of jitter.

According to the above arrangement, on the other hand, the power source voltage detection section controls the slew rate of the output of the output slew rate changing section, when the power source voltage detection section detects the change in the voltage value of the power source voltage.

By decreasing the slew rate of the output within the range in which the transmission speed is not decreased, the parasite current between the output terminal and the photodiode is decreased. This makes it possible to reduce the parasite current to be superimposed on the electric signal thus outputted. Thus, it becomes possible to reduce jitter in the output signal.

For a fuller understanding of the nature and advantages of the invention, reference should be made to the ensuing detailed description taken in conjunction with the accompanying drawings.

BRIEF DESCRIPTION OF THE DRAWINGS

FIG. 6(a) shows an output waveform of a slew rate variable output stage in case where there is no erroneous operation in output. FIG. 6(b) shows an output waveform of a charging and discharging circuit by a capacitor in case where there is no erroneous operation in the output. FIG. 6(c) shows an output waveform of an integrating circuit, in case where there is no erroneous operation. FIG. 6(d) shows an output waveform of the slew rate variable output stage in case where there is erroneous operation in the output. FIG. 6(e) shows an output waveform of the charging and discharging circuit by the capacitor in case where there is erroneous operation in the output. FIG. 6(f) shows an output waveform of the integrating circuit, in case where there is erroneous operation.

FIG. 7(a) shows an output waveform of a slew rate variable output stage in case where there is no erroneous operation in output. FIG. 7(b) shows an output waveform of a charging and discharging circuit by a capacitor in case where there is no erroneous operation in the output. FIG. 7(c) shows an output waveform of an integrating circuit, in case where there is no erroneous operation. FIG. 7(d) shows an output waveform of the slew rate variable output stage in case where there is erroneous operation in the output. FIG. 7(e) shows an output waveform of the charging and discharging circuit by the capacitor in case where there is erroneous operation in the output. FIG. 7(f) shows an output waveform of the integrating circuit, in case where there is erroneous operation.

DESCRIPTION OF THE EMBODIMENTS

Referring to FIGS. 1 to 10, an embodiment of the present invention is described below.

Figure 1:
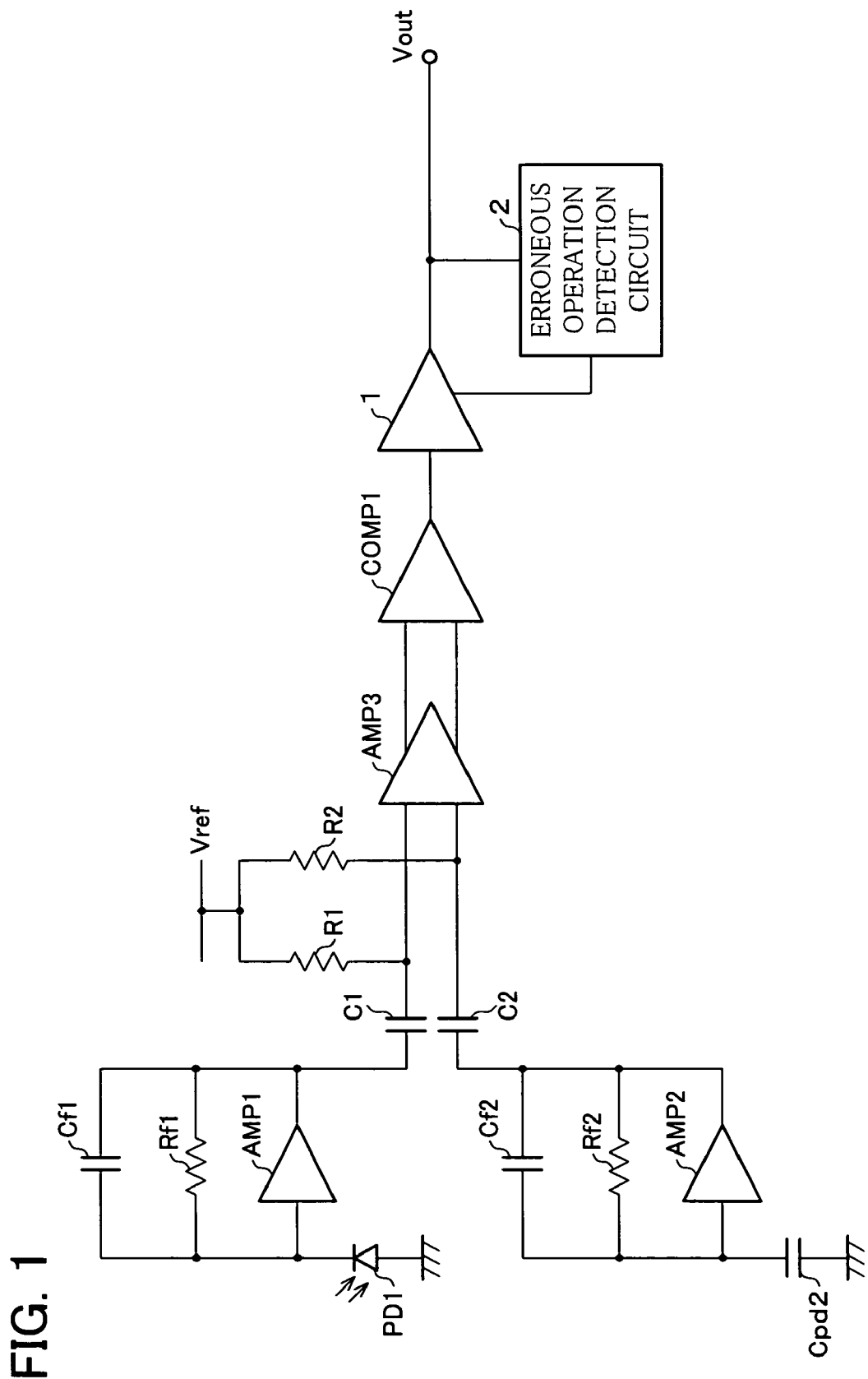
FIG. 1 is a circuit diagram schematically illustrating a photoreceptor of an embodiment of the present invention.

FIG. 1 is a circuit diagram schematically illustrating a configuration of a photoreceptor of the present embodiment. The photoreceptor is provided with a photodiode (photoelectric converting means) PD1 for receiving an optical signal transmitted via an optical fiber, and a signal processing circuit for performing signal processing in accordance with output of the photodiode PD1. The photodiode PD1 and the signal processing circuit are integrated in a signal chip, thereby constituting an OEIC (Optoelectronic IC).

[Circuit Configuration of the Photoreceptor]

First of all, a circuit configuration of the photoreceptor is explained. An output terminal of the photodiode PD1 is connected with an input terminal of the amplifier AMP1. A capacitor Cf1 and a resistor Rf1 are connected to the amplifier AMP1 in parallel. An output terminal of the amplifier AMP1 is connected with a capacitor C1.

Meanwhile, a capacitor Cpd2 having the same capacitance as a parasite capacitance caused between the photodiode PD1 and GND is provided. One of terminals of the capacitor Cpd2 is connected with an input terminal of an amplifier AMP2. A capacitor Cf2 and a resistor Rf2 are connected to the amplifier AMP2, in parallel. An output terminal of the amplifier AMP2 is connected with the capacitor C2.

The capacitors C1 and C2 are connected to a constant voltage source Vref respectively via the resistors R1 and R2, and are respectively connected to input terminals of an amplifier circuit AMP3. Output terminals of the amplifier circuit AMP3 are connected to input terminals of a hysteresis comparator COMP1. An output terminal of the hysteresis comparator COMP1 is connected with an input terminal of a slew rate variable output stage 1. A slew rate of the slew rate variable output state (output means, output circuit) 1 is changed by an erroneous operation detection circuit (erroneous operation detection means, erroneous operation detection circuit) 2. Output of the slew rate variable output means 1 is outputted from an output terminal Vout of the photoreceptor. The circuit configuration from the photodiode PD1 to the output terminal Vout corresponds to the signal processing circuit.

[Operation of the Photoreceptor]

Next, operation of the photoreceptor is explained. The photodiode PD1 generates a current signal that is in proportion with intensity of an optical signal. A photoelectric current detected by the photodiode PD1 is converted to a voltage linearly by the current-to-voltage conversion amplifier, which includes the amplifier AMP1, the resistor Rf1, and the capacitor Cf1. Then, a bypass filter including the capacitor C1 and the resistor Rf1 removes a low frequency component from the voltage that has been converted from the photocurrent. After that, an operating point is given to the voltage by passing through the resistor R1 connected to the constant voltage source Vref. Then, the voltage is supplied to the AMP3.

On the other hand, the capacitor Cpd2 having the same capacitance as the parasite capacitance caused between the photodiode and the GND, is connected to the current-to-voltage conversion amplifier including the amplifier AMP2, the resistor Rf2, and the capacitor Cf2. A current supplied from the capacitor Cpd2 is converted into a voltage by the current-to-voltage amplifier. Then, a bypass filter including the capacitor C2 and the resistor Rf2 removes a low frequency component from the voltage that has been converted from the current. This renders the voltage differential with respect to the output of the amplifier AMP1. After that, the voltage is supplied to the amplifier circuit AMP3.

Output of the amplifier AMP3 is supplied to the hysteresis comparator COMP1. Then, a waveform of the output is shaped. After that, the output is converted into a high-low digital signal by the slew rate variable output stage 1, and then outputted. The following explains the amplifier circuit AMP3 and the hysteresis comparator COMP1. The amplifier circuit AMP3 amplifies an amplitude of a signal. The amplifier circuit AMP3 may be so arranged that two or three stages of amplifier are serially connected therein, even though the amplifier circuit AMP3 includes only one stage of amplifier in FIG. 1. The hysteresis comparator COMP1 performs the waveform shaping by cutting off the thus amplified signal at a certain threshold level. The hysteresis comparator COMP1 has a hysteresis property. Thus, it is possible to prevent erroneous operation such as chattering and the like when the signal passes the threshold level.

An output terminal of the slew rate variable output stage 1 is connected with an input terminal of the erroneous operation detection circuit 2. When erroneous operation occurs in output of the slew rate variable output stage 1, the erroneous operation detection circuit 2 detects the erroneous operation in the output, and performs such control as to decrease a slew rate (dV/dt) of the output of the slew rate variable output stage 1 in a range within which the signal can be transmitted. With this arrangement, the parasite current flowing from the output terminal to the photodiode PD1 is decreased, thereby preventing the erroneous operation.

The following explains the decrease in the slew rate (dV/dt) in a range within which the signal can be transmitted. For example, in case a signal of 25 Mbps is to be transmitted, a minimum pulse width is 40 ns. Thus, in case where a sum of periods of the rise and fall of the signal is 20 ns, the pulse has a flat portion of 20 ns, whereby the signal can be transmitted. On the other hand, in case where a sum of periods of the rise and fall is 40 ns or more, the signal has a triangle-shaped waveform, thereby being abnormal pulse signal. In this case, the signal cannot be transmitted. In short, the slew rate in a range within which the signal can be transmitted is one at which the signal can be normal pulse signal in consideration of the periods of the rise and fall of the signal.

[Configuration of the Erroneous Operation Detection Circuit]

Figure 4:
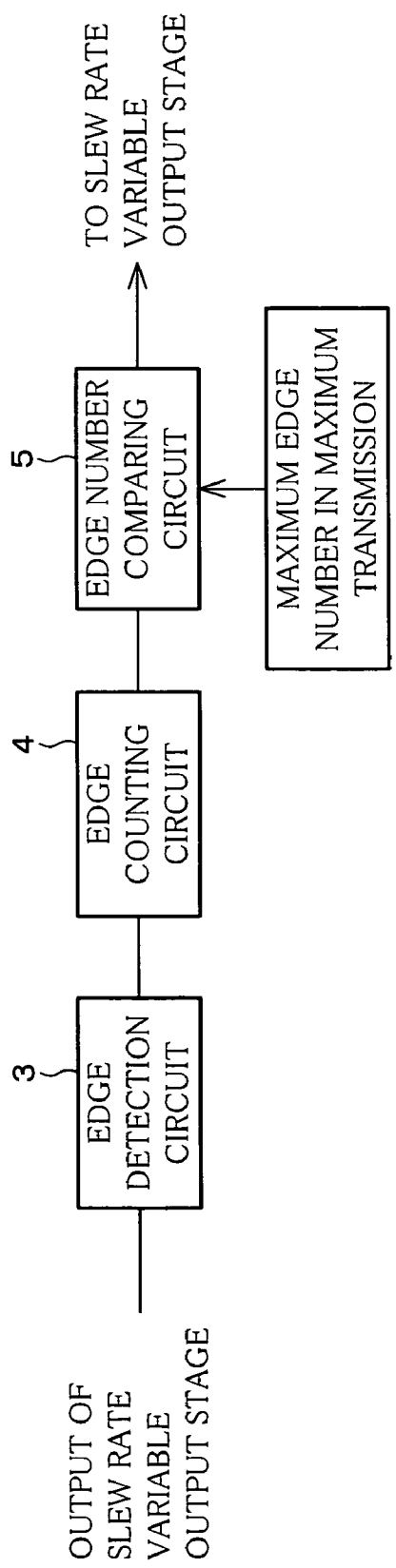
FIG. 4 is a block diagram schematically illustrating a configuration of an erroneous operation detection circuit shown in FIG. 1.

FIG. 4 is a block diagram illustrating a configuration of the erroneous operation detection circuit 2. As shown in FIG. 4, the erroneous operation detection circuit 2 is provided with an edge detection circuit (edge detection means) 3, an edge counting circuit 4, and an edge number comparing circuit (comparing means, comparing circuit) 5. The edge detection circuit 3 detects edges of rise and fall of an output signals supplied from the slew rate variable output stage. The edge counting circuit 4 counts a number of edges detected by the edge detection circuit 3 per unit time (the edge counting circuit 4 counts how many number of edges are detected by the edge detection circuit 3 per unit time). The edge number comparing circuit 5 compares (a) the number counted by the edge counting circuit 4 with (b) a number of the edges to be present in the unit time on assumption that maximum transmission can be carried out with no erroneous operation.

When the edge number comparing circuit 5 finds that the number of the edges detected per unit time exceeds the number of edges to be present in the unit time on assumption that maximum transmission can be carried out with no erroneous operation, the edge number comparing circuit 5 judges that the erroneous operation has occurred in the output, and performs such control that the slew rate of the output of the slew rate variable output stage 1 is decreased. For example, in case the transmission speed is 25 Mbps, the signal has a frequency of 12.5 MHz. Thus, the number of edges per unit time is $12.5 \times 10^6 \times 2 = 25 \times 10^6$, considering that one cycle has two edges for the rise and fall.

Figure 5:
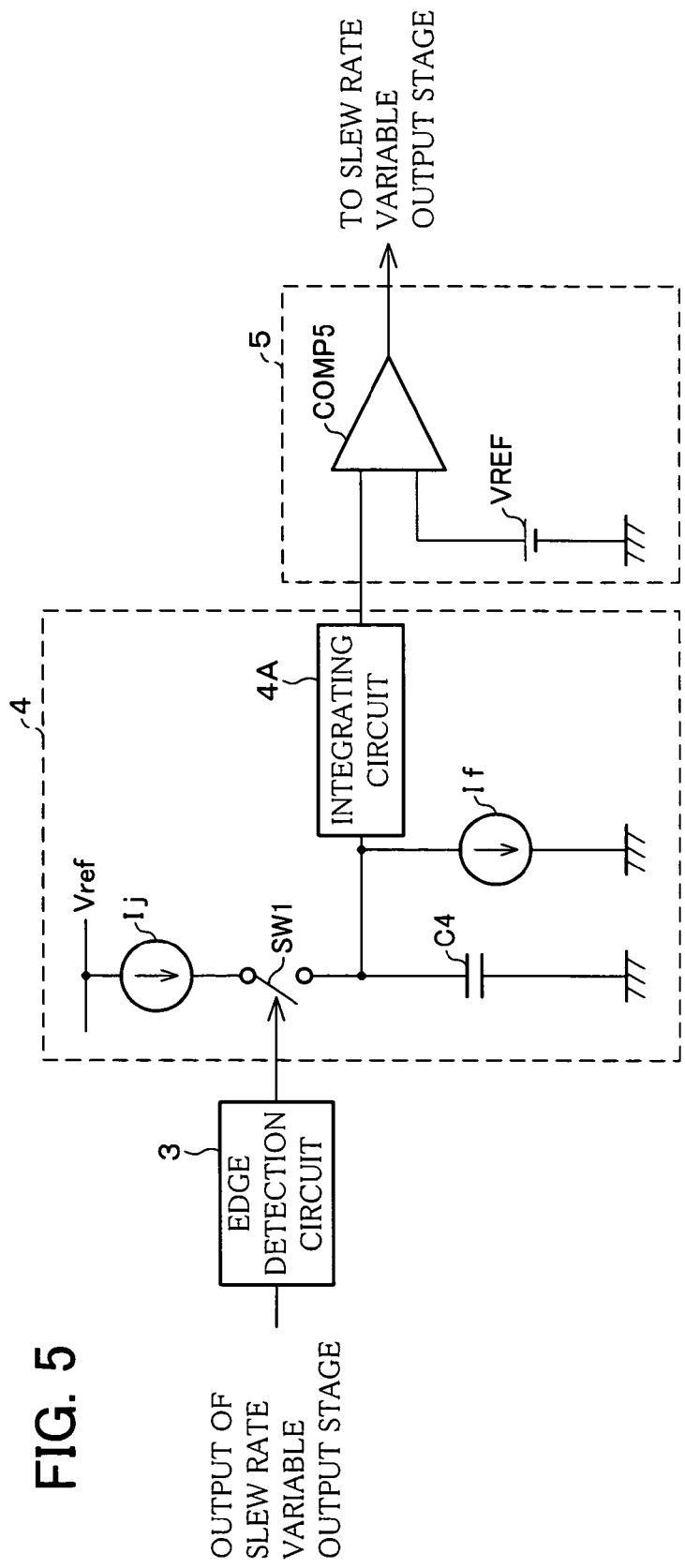
FIG. 5 is a circuit diagram showing an example in which the erroneous operation detection circuit 2 shown in FIG. 4 is concretely configured.
Figure 6:
FIGS. 6(a) to 6(f) are waveform diagrams showing output waveforms of constituent elements of the photoreceptor provided with the erroneous operation detection circuit of FIG. 5.
Figure 6:
Figure 6:
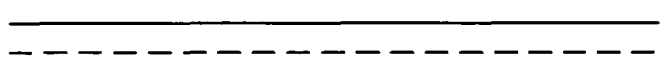
Figure 6:
Figure 6:
Figure 6:
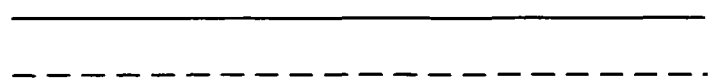
Figure 7:
FIGS. 7(a) to 7(f) are waveform diagrams showing output waveforms of constituent elements of the photoreceptor provided with an erroneous operation detection circuit other than the erroneous operation detection circuit shown in FIG. 5.
Figure 7:
Figure 7:
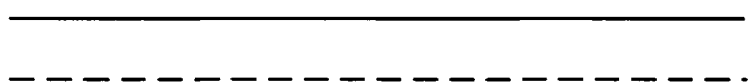
Figure 7:
Figure 7:
Figure 7:
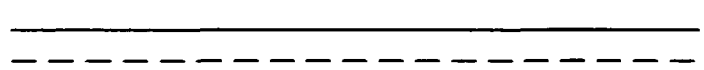

FIG. 5 shows an example in which the erroneous operation detection circuit 2 shown in FIG. 4 is concretely configured. As shown in FIG. 5, the edge counting circuit 4 is provided with a switch SW1, a capacitor C4, and an integrating circuit 4A. Moreover, the edge number comparing circuit 5 is provided with a comparator COMP5.

When the edge detection circuit 3 detects an edge, the switch (switching means, switching circuit) SW1 is turned ON, so as to charge the capacitor C4 rapidly by a charging current Ij. On the other hand, the electric charge charged in the capacitor C4 is to be discharged by a constant discharging current If.

Then, the integrating circuit 4A integrates a potential of the capacitor C4, so as to count the number of edges per unit time. The detection of the erroneous operation is carried out by comparing an output voltage of the integrating circuit 4A with a reference voltage VREF, by using the comparator COMP5 of the edge number comparing circuit 5.

The detection of the erroneous operation is carried out by using a phenomenon that the potential of output of the integrating circuit 4A is higher in case where there is the erroneous operation, compared with a case where there is no erroneous operation. FIGS. 6(a) to 6(f) show output waveforms of (i) the output of the slew rate variable output stage 1, (ii) output of a charging and discharging circuit by the capacitor C4, and (iii) output of the integrating circuit 4A, for the cases where there is erroneous operation, and where there is no erroneous operation.

When the output is carried out without erroneous operation (there is no erroneous operation in the output), the output waveform of the slew rate variable output stage 1 has edges only for the rise and fall of the pulse. The charging and the discharging circuit is charged every time the edge is detected, and then is discharged until the next edge. On the other hand, when the output is carried out with erroneous operation (there is erroneous operation in the output), an edge other than the normal edges for the rise and fall of the pulse is detected in the output waveform of the slew rate variable output stage 1. In this case, the charging and discharging circuit is charged every time the edge is detected so that a current value of output of the charging and discharging circuit is kept relatively high. Thus, output of the integrating circuit 4A has a higher value than in the normal state.

The utilization of this phenomenon enables to detect the erroneous operation by comparing, with the reference voltage VREF, the output voltage of the integrating circuit 4A by using the comparator COMP5 of the edge number comparing circuit 5. In short, the erroneous operation detection circuit is so arranged that, because a D/T ratio of a voltage waveform of the capacitor C4 is in proportion to an amount of the erroneous operation per unit time, the integrating circuit 4A detects the D/T ratio and it is judged that erroneous operation occurs if the D/T ratio becomes equal to or higher than a certain level.

An output resistance of the slew rate variable output stage 1 is changed in accordance with a result of the detection carried out by the edge number comparing circuit 5. In this way, the slew rate of the output can be controlled.

Note that it may be so arranged that the capacitor C1 is rapidly discharged a in a period in which the edge is detected and is charged by a constant charging current, on the contrary to the example shown in FIG. 5, in which the capacitor C4 is charged during the period in which the edge is detected and discharged in a constant rate. In other words, it may be so arranged that the current Ij of this case flows oppositely with respect to the current Ij of FIG. 5, and the same is true of the current If. In this configuration, the potential of the output of the integration circuit 4A becomes low when there is the erroneous operation. FIGS. 7(a) to 7(f) show output waveforms of (i) the output of the slew rate variable output stage 1, (ii) output of a charging and discharging circuit by the capacitor C4, and (iii) output of the integrating circuit 4A, for the cases where there is erroneous operation, and where there is no erroneous operation, with respect to this example.

As shown in FIGS. 7(a) to (f), the output waveform of the slew rate variable output stage 1 has edges only for the rise and fall of the pulse, in case where there is no erroneous operation in the output. The charging and the discharging circuit is charged every time the edge is detected, and then is discharged until the next edge. On the other hand, when the output is carried out with erroneous operation (there is erroneous operation in the output), an edge other than the normal edges for the rise and fall of the pulse is detected in the output waveform of the slew rate variable output stage 1. In this case, the charging and discharging circuit is charged every time the edge is detected so that a current value of output of the charging and discharging circuit is kept relatively low. Thus, output of the integrating circuit 4A has a lower value than in the normal state.

EXAMPLE 1 OF THE PHOTORECEPTOR

Figure 2:
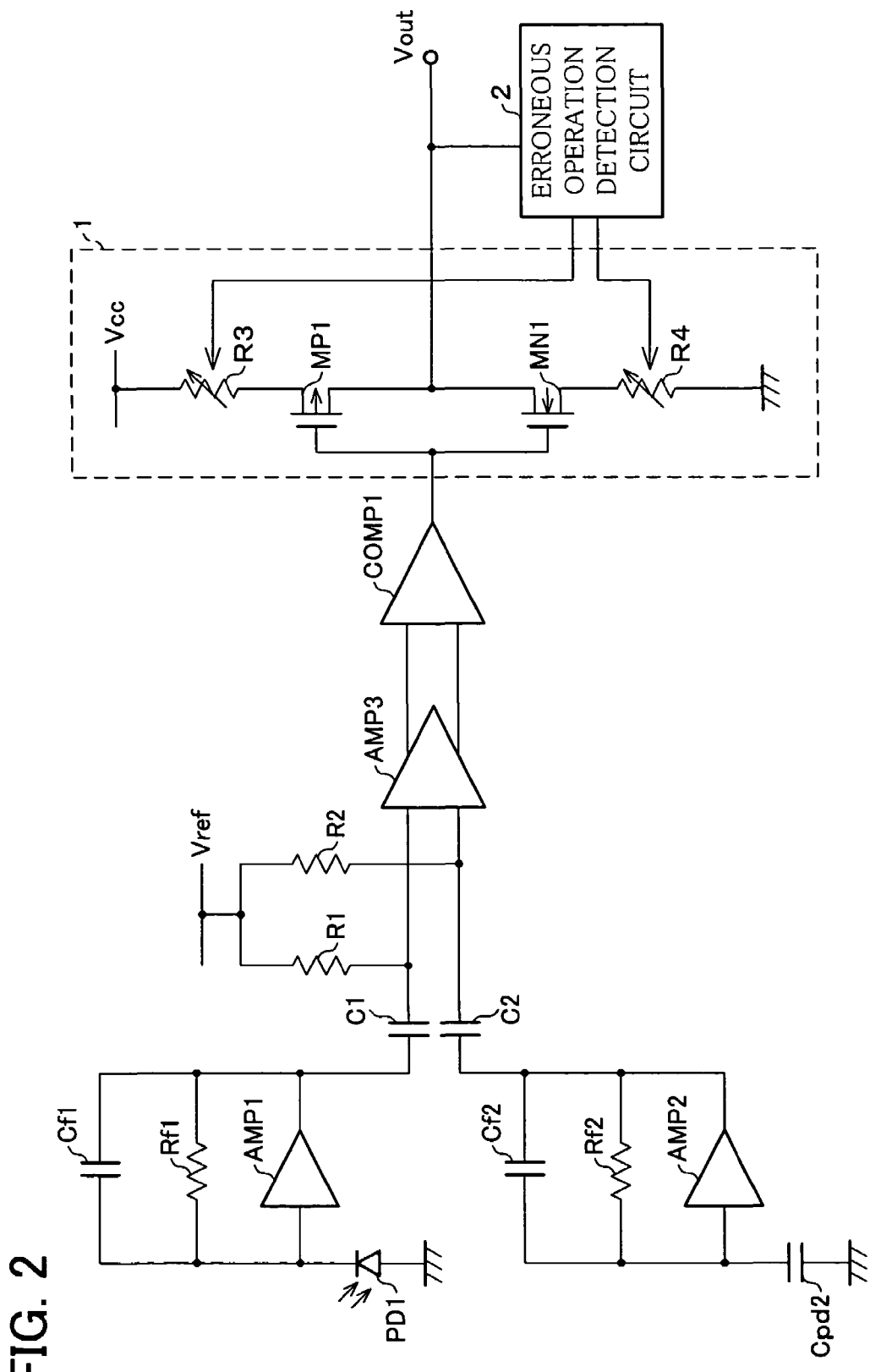
FIG. 2 is a circuit diagram showing an example of the photoreceptor of the FIG. 1.

Next, a concrete example of the photoreceptor, especially, an concrete example of the slew rate variable output stage 1 is explained, with reference to FIG. 2. As shown in FIG. 2, the slew rate variable output stage 1 is provided with an inverter including a transistor MP1 composed of a Pch (P channel) MOS FET (Field Effect Transistor) and a transistor MN1 composed of an Nch (N channel) MOS FET. Further, variable resistors (output slew rate changing means, output slew rate changing element) R3 and R4 are respectively provided between the transistor MP1 and a constant voltage source Vcc, and between the transistor MN1 and GND (a grounding wire) (the variable resistors have a variable slew rate). An input line of an erroneous operation detection circuit 2 is connected to a line between an output terminal of the inverter and an output terminal Vout of the photoreceptor. Output terminals of the erroneous operation detection circuit 2 are connected to the variable resistors R3 and R4, respectively.

When the erroneous operation detection circuit 2 detects the erroneous operation, the erroneous operation detection circuit 2 controls the variable resistors R3 and R4 so as to increase resistances of the variable resistors R3 and R4. This lowers a slew rate of the output of the slew rate variable output stage 1, thereby preventing the erroneous operation.

EXAMPLE 2 OF THE PHOTORECEPTOR

Figure 3:
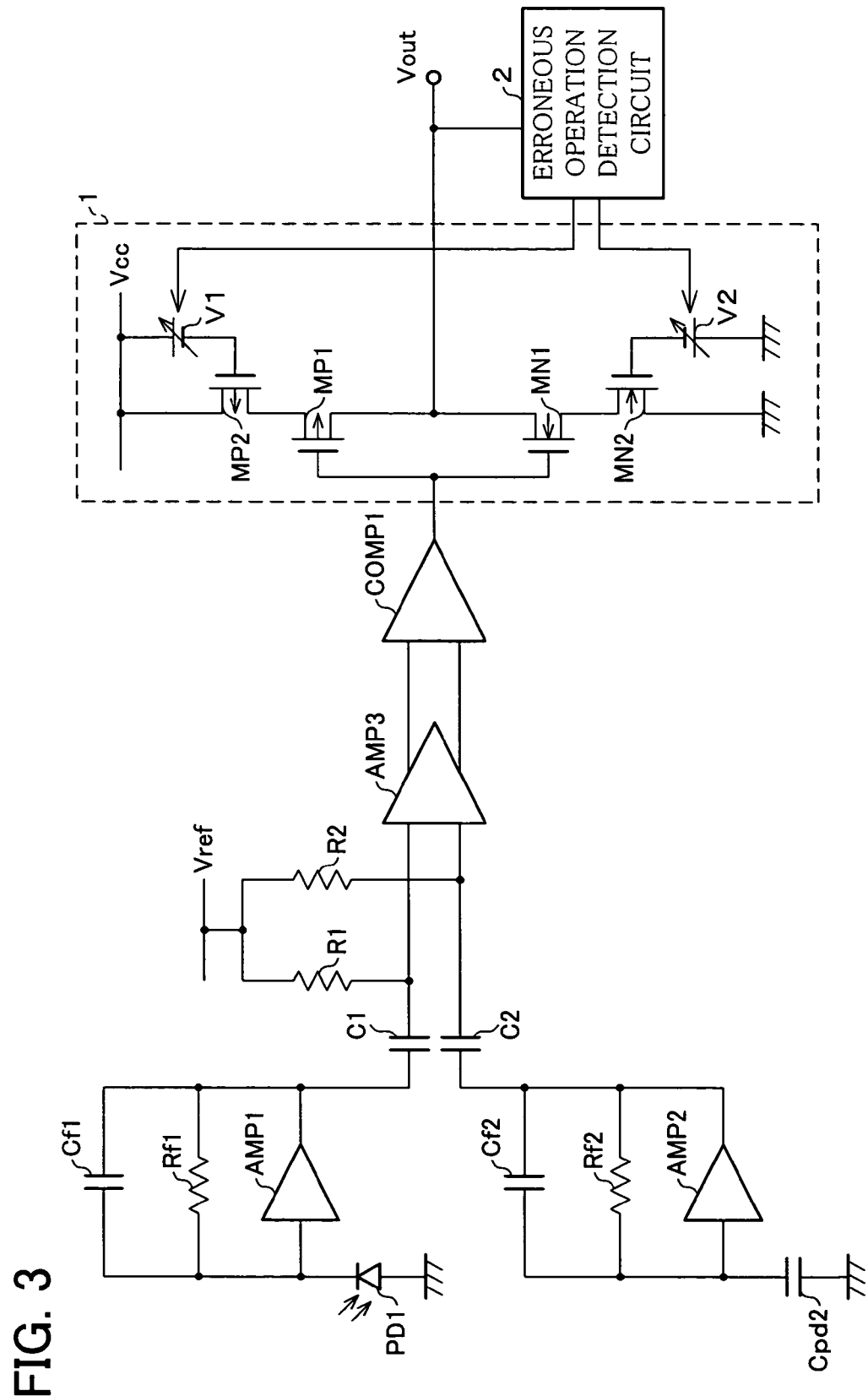
FIG. 3 is a circuit diagram illustrating another example of the photoreceptor, which is different from that of FIG. 2.

Next, another example of the photoreceptor, especially, another concrete example of the slew rate variable output stage 1 is explained, referring to FIG. 3. As shown in FIG. 3, the slew rate variable output stage 1 is provided with an inverter including a transistor MP1 composed of a Pch MOS FET, and a transistor MN1 composed of an Nch MOS FET. Further, a transistor MP2 and a transistor MN2 are provided respectively between the transistor MP1 and a constant voltage source Vcc, and between the transistor MN1 and GND, the transistor MP2 being composed of a Pch MOS FET, and the transistor MN2 being composed of an Nch MOS FET. Further, a variable voltage circuit V1 (output slew rate changing means, output slew rate changing element) is provided between a gate of the transistor MP2 and the constant voltage source Vcc, and a variable voltage circuit V2 (output slew rate changing means, output slew rate changing element) is provided between a gate of the transistor MN2 and GND.

When an erroneous operation detection circuit 2 detects erroneous operation, the erroneous operation detection circuit 2 controls voltage values of the variable voltage circuits V1 and V2. This lowers a slew rate of output of the slew rate variable output stage 1, thereby preventing erroneous operation.

EXAMPLE 3 OF THE PHOTORECEPTOR

Figure 8:
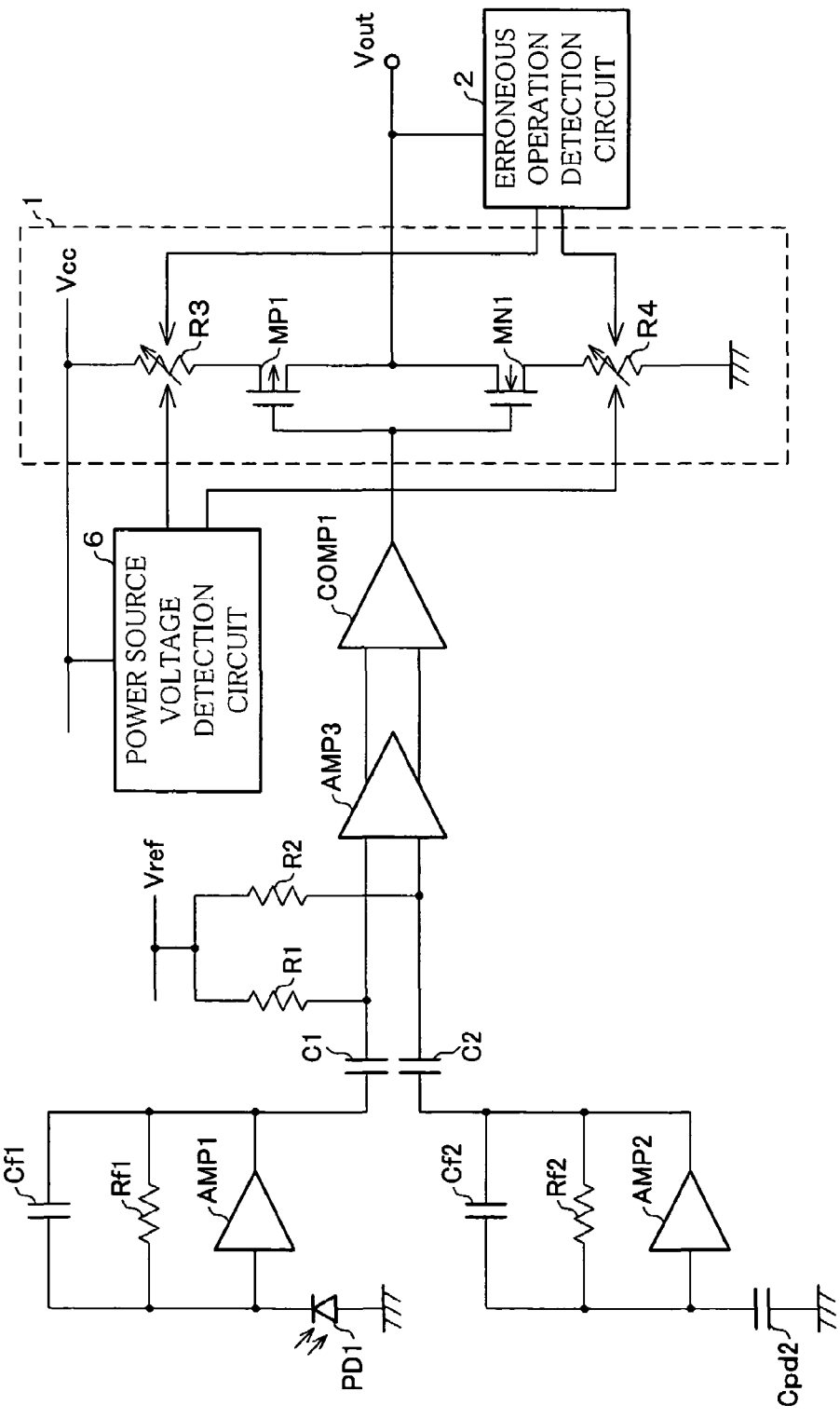
FIG. 8 is a circuit diagram showing still another example of the photoreceptor, which is different from those shown in FIGS. 2 and 3.

Next, still another example of the photoreceptor is explained, referring to FIG. 8. As shown in FIG. 8, a slew rate variable output stage 1 is provided with an inverter composed of a transistor MP1 composed of a Pch MOS FET, and a transistor MN1 composed of an Nch MOS FET. Further, variable resistors (output slew rate changing means, output slew rate changing element) R3 and R4 are respectively provided between the transistor MP1 and a constant voltage source Vcc, and between the transistor MN1 and GND. An input line of the erroneous operation detection circuit 2 is connected to a line between an output terminal of the inverter and an output terminal Vout of the photoreceptor. Output terminals of the erroneous operation detection circuit 2 are connected to the variable resistors R3 and R4, respectively. Example 3 is configured identically with Example 1 in terms of the configuration discussed hereinbefore.

In the present example, a power source voltage detection circuit (power source voltage detection means) 6 is provided. An input terminal of the power source voltage detection circuit 6 is connected with the constant voltage source Vcc. The power source voltage detection circuit 6 controls resistance values of the variable resistors R3 and R4.

In case where the slew rate variable output stage 1 is provided with a CMOS inverter circuit as described above, gates of the transistors MP1 and MN1 receive a voltage whose low level is a GND potential and whose high level is a Vcc potential. Thus, when a power source voltage is increased, ON resistances of the transistors MP1 and MN1 are decreased. The decrease in the ON resistances lowers an output resistance, increases a slew rate and amplitude of output. Thus, when the ON resistances are decreased, a parasite current caused between the output terminal and the photodiode is increased, as shown by Equation (5) mentioned above. The thus increased parasite current increases the possibility of the erroneous operation.

On the contrary, in the above mentioned arrangement, when the power source voltage detection circuit 6 detects that the power source voltage is increased, the power source voltage detection circuit 6 controls the variable resistors R3 and R4 so as to increase the resistance values of the variable resistors R3 an R4. The increase of the slew rate can be prevented by increasing the resistance values of the variable resistors R3 and R4 as such.

Note that the present invention may be so arranged that only the power source voltage detection circuit 6 is provided, even though the present example is so arranged that both the power source voltage detection circuit 6 and the erroneous operation detection circuit 2 are provided. In short, when the parasite current occurs due to the change in the power source voltage, a problem caused by the parasite current can be prevented by the control performed by the power source voltage detection circuit 6.

EXAMPLE 4 OF THE PHOTORECEPTOR

Figure 9:
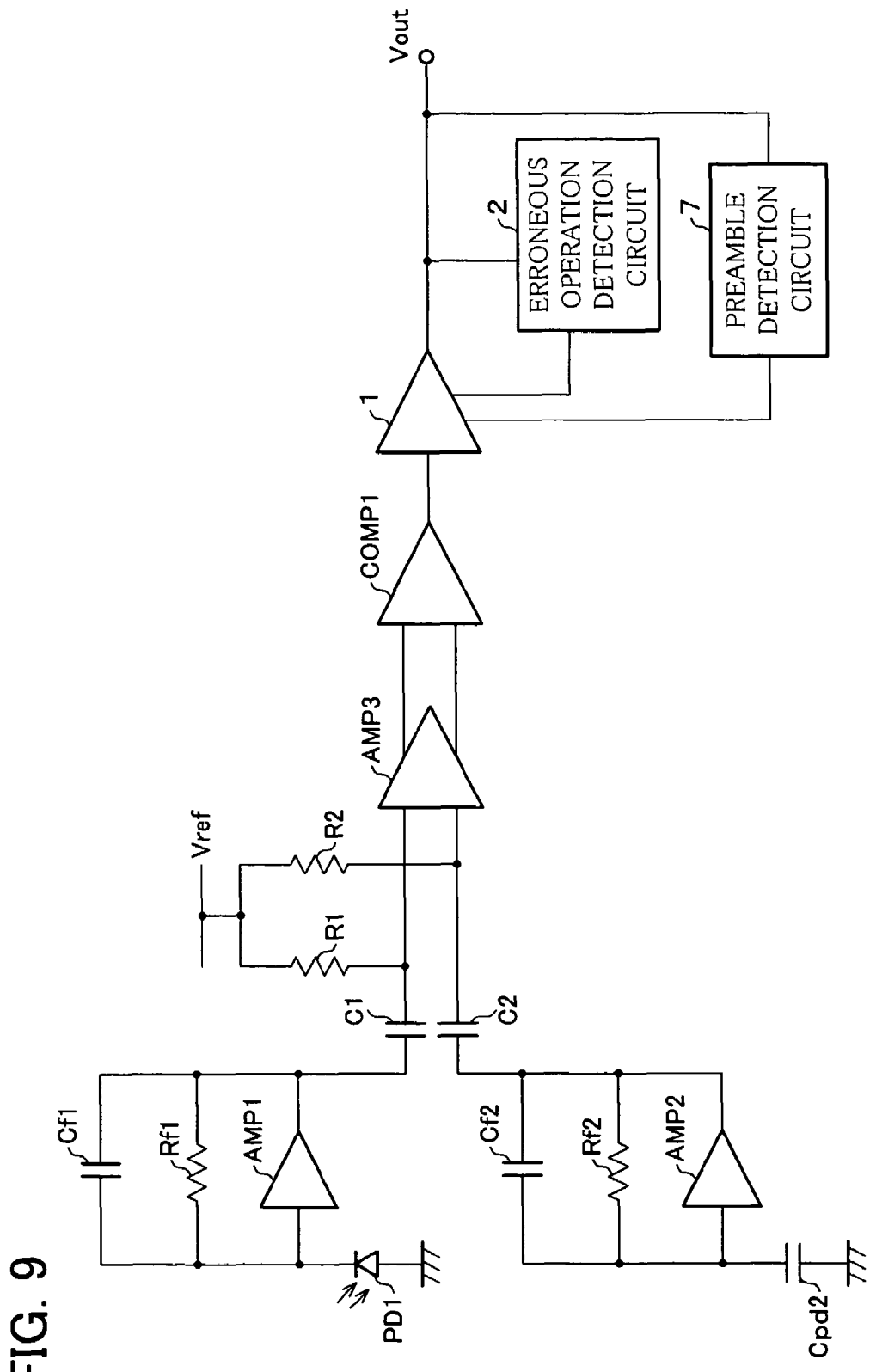
FIG. 9 is a circuit diagram showing yet another example of the photoreceptor, which is different from those shown in FIGS. 2, 3, and 8.

Next, yet another example of the photoreceptor is explained below, referring to FIG. 9. As shown in FIG. 9, the photoreceptor of the present example is so arranged that a slew rate variable output stage 1 is controlled by the erroneous operation detection circuit 2 and a preamble detection circuit (preamble detection means) 7.

Figure 10:
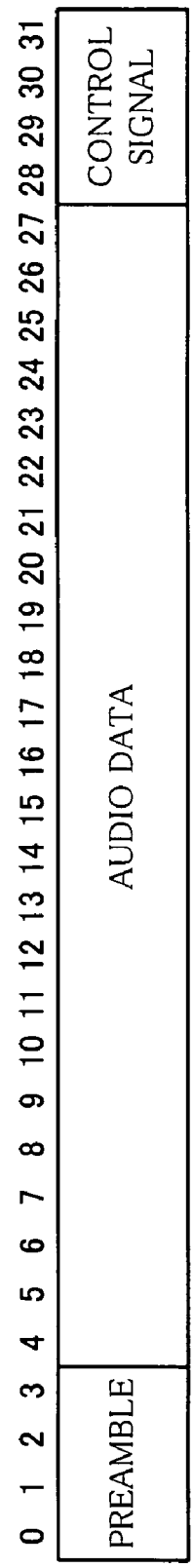
FIG. 10 is a diagram showing a frame structure formed in a data transmission format.
Figure 11:
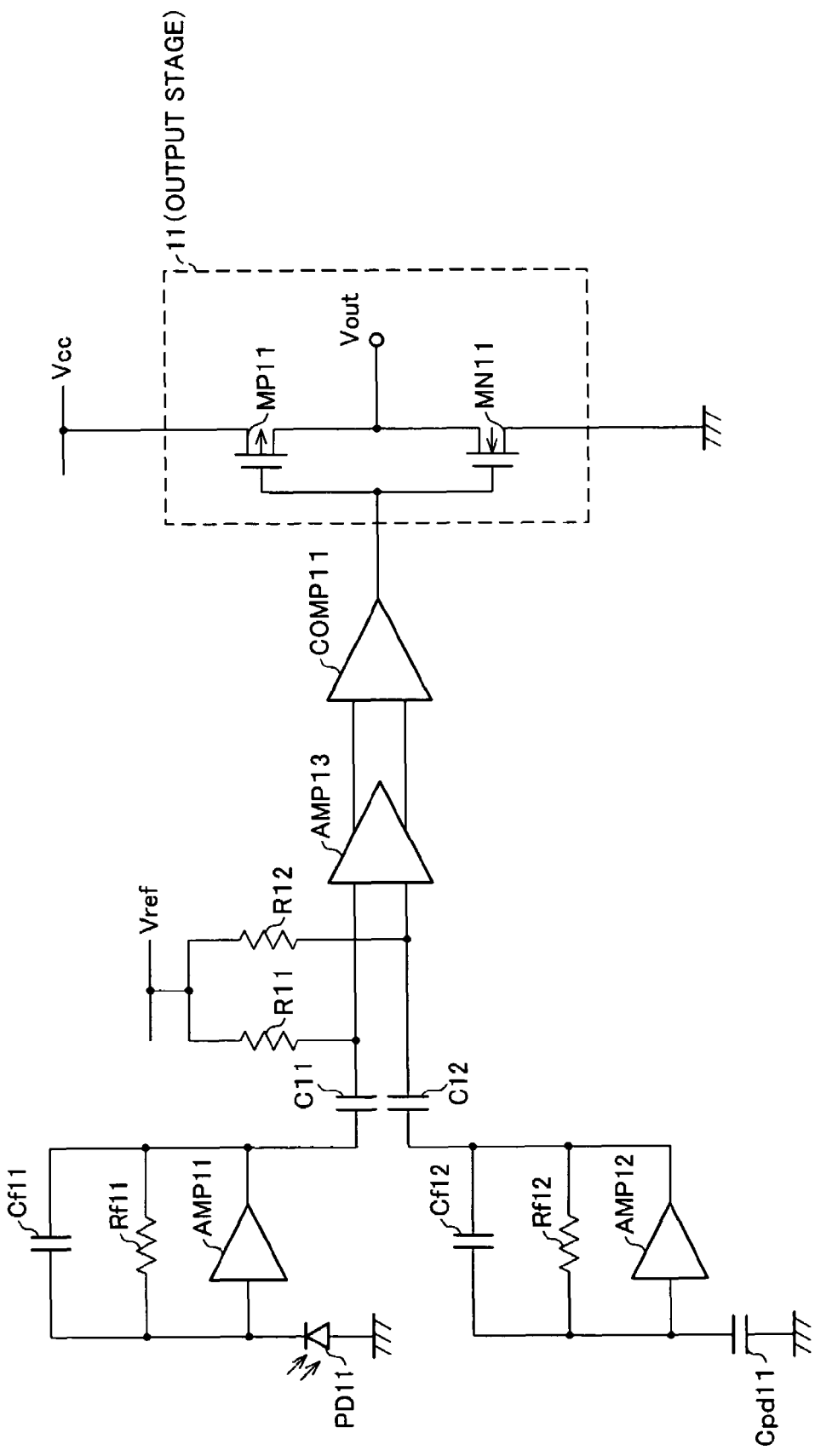
FIG. 11 is a block diagram schematically illustrating a configuration of a conventional photoreceptor for digital audio optical fiber.
Figure 12:
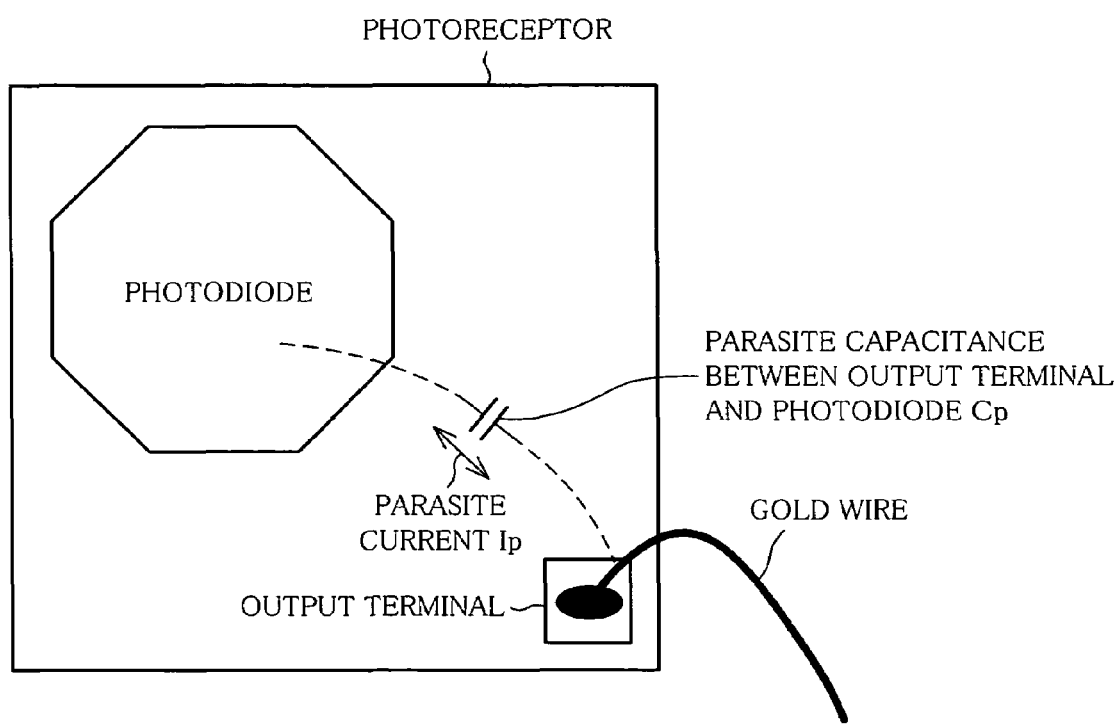
FIG. 12 is an explanatory view explaining a parasite current caused in the photoreceptor shown in FIG. 11.
Figure 13:
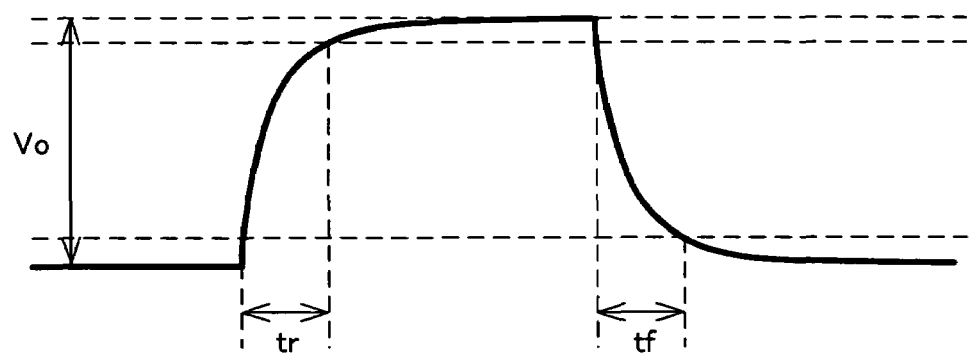
FIG. 13(a) is a waveform diagram showing an output waveform of the photoreceptor of FIG. 11.
FIG. 13(b) is a waveform diagram showing a waveform of the parasite current of the photoreceptor of FIG. 11.
Figure 13:
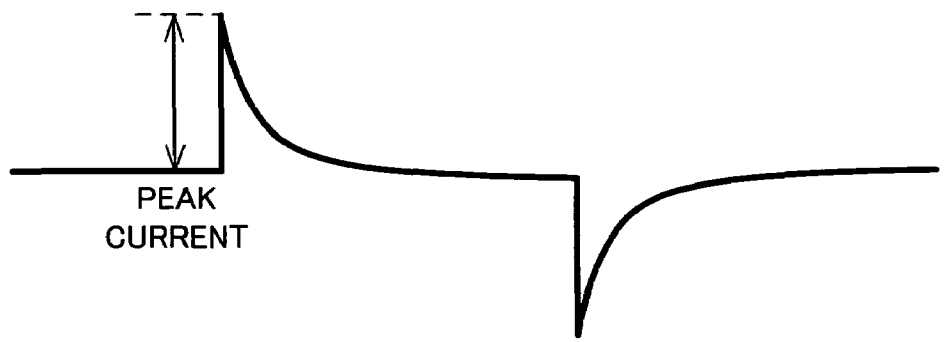

To begin with, explained below is a data structure for a case where a transmitted signal is a digital audio signal. A data transmission format of the digital audio signal is in compliance with IEC 60958. FIG. 10 illustrates a frame structure formed in the data transmission format. As shown in FIG. 10, the frame has a data area at its head portion. The data area is called "preamble". An area of audio data follows the preamble. Moreover, the frame has a data area for a control signal at its tail portion.

The preamble, which locates at the head portion of the frame as described above, is irrelevant with the actual audio data. That is, the preamble is just for indicating which type the frame is, and for synchronization. Specifically, the preamble has three types, namely, "B", "M", and "W", and is encoded depending on whether a preceding symbol is "0" or "1", as shown in Table 1.

TABLE 1

| Preamble | Preceding Symbol "1" | Preceding Symbol "0" |
| --- | --- | --- |
| B | 00010111 | 11101000 |
| M | 00011101 | 11100010 |
| W | 00011011 | 11100100 |

Note that the data portion is also encoded as shown in Table 2.

TABLE 2

| DATA | Preceding Symbol "1" | Preceding Symbol "0" |
| --- | --- | --- |
| 0 | 00 | 11 |
| 1 | 01 | 10 |

Each dada is encoded in accordance with the preceding symbol in compliance with the biphase-mark-code method, as shown in Table 2. More specifically, in case the preceding symbol is "1" and data is "0", the data portion is encoded as "00", whereas the data portion is encoded as "01" if the preceding symbol is "1" and the data is "1". In case where the preceding symbol is "0" and the data is "0", the data portion is encoded as "11,", whereas as the data portion is encoded as "10" if the preceding symbol is "0" and the data "1".

In the present Example, the preamble detection circuit 7 monitors a signal outputted from the slew rate variable output stage 1, so as to detect whether or not the signal currently transmitted is a data signal of the preamble. For example, in case of the above-mentioned frame structure, the signal currently transmitted is recognized as the preamble data when the preamble detection circuit 7 detects that three "1" or "0" are continuous in the signal that the preamble detection circuit 7 monitors.

It is so arranged that, when the erroneous operation detection circuit 2 detects the erroneous operation, the slew rate of the output of the slew rate variable output stage 1 is so controlled that the slew rate is changed only during a period in which the preamble detection circuit 7 detects the preamble.

The reason why the slew rate is changed only during the period in which the preamble is outputted is as follows: there is a possibility that the edges of the rise and fall of the pulse are shifted by changing the slew rate during that period in the signal transmission in which the data area in the frame is outputted, whereby jitter is caused. In short, if the slew rate is frequently change during the period in which the data area in the frame is outputted, the more jitter is caused, thus resulting in such a problem that acoustic quality is deteriorated in case of audio data.

On the other hand, the above arrangement can solve the problem associated with the occurrence of the jitter, because the slew rate is changed only during the period in which the preamble is outputted, not during the period in which the area other than the preamble, that is, the data area is outputted. Thus, in case where data transmitted is audio data, the above arrangement makes it possible to transmit audio data of high acoustic quality.

The photoreceptor of the present invention having the above arrangement may be so arranged that the erroneous operation detection means monitors a pulse width of the digital signal thus outputted, in order to judge whether or not the erroneous operation occurs.

In case the parasite current causes erroneous operation in the output signal (the signal thus outputted), the occurrence of the erroneous operation causes a pulse having a shorter width than the pulse width of the transmission signal in a normal state. Thus, it is possible to attain accurate detection of the erroneous operation in the output signal by monitoring the pulse width of the output signal as in the above arrangement.

Moreover, the photoreceptor of the present invention having the above arrangement may be so arranged that the erroneous operation detection means counts a number of edges present in the digital signal per unit time, in order to judge whether or not the erroneous operation occurs.

In case the parasite current causes erroneous operation in the output signal, a greater number of edges are included in the output signal (the signal thus outputted) than the number of edges to be present in the transmission signal in the normal state per unit time. In short, counting the number of edges per unit time is equivalent to monitoring the pulse width of the output signal. Thus, it is possible to attain accurate detection of the erroneous operation in the output signal by counting the number of edges in the output signal per unit time as in the above arrangement.

Furthermore, the photoreceptor of the present invention having the above arrangement may be so arranged that the erroneous operation detection means includes: edge detection means for detecting an edge; a capacitor for being charged and being discharged; switching means being switched ON so as to set the capacitor to a predetermined potential when the edge detection means detects the edge; charging and discharging means for charging or discharging the capacitor at a predetermined rate; an integrating circuit for integrating output of the capacitor; and comparing means for comparing a value of the output of the integrating circuit with a predetermined value.

In the above arrangement, the capacitor is set to the predetermined potential when the edge detection means detects the edge of the output signal (the signal thus outputted). In the period in which no edge is detected, the capacitor is charged or discharged at a constant rate by the charging and discharging means. Thus, the output of the capacitor is changed in accordance with how often the edges are detected.

Thus, the output value of the integrating circuit is changed in accordance with how often the edges are detected. Because of this, it is possible to count the number of edges in the output signal per unit time by detecting, by using the comparing circuit, how large the output value of the integrating circuit is. In other words, according to the above arrangement, it is possible to realize a relatively simple arrangement for judging whether or not the erroneous operation is present in the output signal.

Further, the photoreceptor of the present invention having the above arrangement may be so arranged that the output means includes an inverter including (i) a transistor composed of a P channel MOS FET, and (ii) a transistor composed of an N channel MOS FET, and the output slew rate changing means includes a variable resistor between the inverter and a constant voltage source, and a variable resistor between the inverter and a grounding wire.

According to the above arrangement, it is possible to reduce the slew rate of the output by increasing the resistance of the variable resistors. That is, it is possible to reduce the erroneous operation by decreasing the slew rate of the output, according to the arrangement in which, when the erroneous operation detects erroneous operation, the erroneous operation detection means controls that the resistance of the variable resistors are increased.

Moreover, the photoreceptor of the present invention having the above arrangement may be so arranged that the output means includes an inverter including (i) a transistor composed of a P channel MOS FET, and (ii) a transistor composed of an N channel MOS FET, and the output slew rate changing means includes (a) transistors, respectively located between the inverter and a constant voltage source, and between the inverter and a grounding wire, the transistors composed of MOS FETs, and (b) a variable voltage circuit connected to each of gates of the transistors.

According to the above arrangement, it is possible to change the slew rate of the output by changing the voltage value of the variable voltage circuit. That is, it is possible to change the slew rate of the output by such arrangement that, when the erroneous operation detection means detects erroneous operation, the erroneous operation detection means controls the voltage value of the variable voltage circuit.

Moreover, the photoreceptor of the present invention having the above arrangement may be so arranged that preamble detection means for detecting a preamble of a frame constituting the digital signal outputted from the output means, the erroneous operation detection means performing, only during a period in which the preamble detection means detects the preamble, such control that the slew rate of the output of the output slew rate changing means is decreased.

According to the above arrangement, the slew rate of the output is changed only in the period in which the preamble is outputted, whereas the slew rate of the output is not changed during the period in which the area other than the preamble, that is, the data area is outputted.

In this case, there is a possibility that the rise and fall of the pulse are shifted by changing the slew rate of the output during the period the data area in the frame is outputted. Such shift in the edges of the pulse causes the jitter. In other words, if the slew rate is frequently changed during the period in which the data area in the frame is outputted, the increase of jitter causes deterioration in acoustic quality, in case of the audio data.

According to the above arrangement, on the other hand, the slew rate is changed only during a period in which the preamble is outputted. Thus, this arrangement solves the problem associated with the occurrence of the jitter. Thus, in case the data transmitted is audio data, it is possible to transmit the audio data of high acoustic quality.

Further, the photoreceptor of the present invention having the above arrangement may be so arranged that power source voltage detection means for detecting a voltage value of a power source voltage supplied to the output means, the power source voltage detection means controlling the slew rate of the output slew rate changing means in accordance with a change in the voltage value of the power source voltage.

There is a possibility that the change in the voltage value of the power source voltage supplied to the output means changes the output resistance of the output means as described above, whereby the effect of the parasite current becomes large. In the above arrangement, when the power source voltage detection means detects a change in the voltage value of the power source voltage, the power source voltage detection means controls the slew rate of the output of the output slew rate changing means. This arrangement makes it possible to reduce the parasite current to be superimposed on the output signal. Thus, it is possible to reduce the jitter in the output signal.

Moreover, the photoreceptor of the present invention having the above arrangement may be so arranged that the photoelectric converting means receives a digital audio signal via an optical fiber.

According to the above arrangement, it is possible to convert, into a digital electric signal of high quality in which the jitter or the like is not present, the digital audio signal that is transmitted via the optical fiber. Thus, it is possible to provide a photoreceptor capable of outputting an audio digital signal of excellent acoustic quality.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A photoreceptor comprising:
photoelectric converting means for receiving an optical signal and converting the optical signal into an electric signal;
output means for outputting a digital signal in accordance with the electric signal; and
erroneous operation detection means for monitoring the digital signal thus outputted from the output means, so as to detect erroneous operation,
the output means including output slew rate changing means for changing a slew rate of output of the output means, and
the erroneous operation detection means performing, when the erroneous operation detection means detects the erroneous operation, such control that a transmission speed of the output slew rate changing means is decreased.

2. The photoreceptor as set forth in claim 1, wherein:
the erroneous operation detection means monitors a pulse width of the digital signal thus outputted, in order to judge whether or not the erroneous operation occurs.

3. The photoreceptor as set forth in claim 2, wherein:
the erroneous operation detection means counts a number of edges present in the digital signal per unit time, in order to judge whether or not the erroneous operation occurs.

4. the photoreceptor as set forth in claim 3, wherein:
the erroneous operation detection means includes:
edge detection means for detecting an edge;
a capacitor for being charged and being discharged;
switching means being switched ON so as to set the capacitor to a predetermined potential when the edge detection means detects the edge;
charging and discharging means for charging or discharging the capacitor at a predetermined rate;
an integrating circuit for integrating output of the capacitor; and
comparing means for comparing a value of the output of the integrating circuit with a predetermined value.

5. The photoreceptor as set forth in claim 1, wherein:
the output means includes an inverter including (i) a transistor composed of a P channel MOS FET, and (ii) a transistor composed of an N channel MOS FET, and
the output slew rate changing means includes a variable resistor between the inverter and a constant voltage source, and a variable resistor between the inverter and a grounding wire.

6. The photoreceptor as set forth in claim 1, wherein:
the output means includes an inverter including (i) a transistor composed of a P channel MOS FET, and (ii) a transistor composed of an N channel MOS FET, and
the output slew rate changing means includes (a) transistors, respectively located between the inverter and a constant voltage source, and between the inverter and a grounding wire, the transistors composed of MOS FETs, and (b) a variable voltage circuit connected to each of gates of the transistors.

7. The photoreceptor as set forth in claim 1, further comprising:
preamble detection means for detecting a preamble of a frame constituting the digital signal outputted from the output means,
the erroneous operation detection means performing, only during a period in which the preamble detection means detects the preamble, such control that the slew rate of the output of the output slew rate changing means is decreased.

8. The photoreceptor as set forth in claim 5, further comprising:
power source voltage detection means for detecting a voltage value of a power source voltage supplied to the output means,
the power source voltage detection means controlling the slew rate of the output slew rate changing means in accordance with a change in the voltage value of the power source voltage.

9. The photoreceptor as set forth in claim 1, wherein:
the photoelectric converting means receives a digital audio signal via an optical fiber.

10. A photoreceptor, comprising:
photoelectric converting means for receiving an optical signal and converting the optical signal into an electric signal;
output means for outputting a digital signal in accordance with the electric signal; and
power source voltage detection means for detecting a voltage value of a power source voltage supplied to the output means,
the output means including output slew rate changing means for changing a slew rate of output of the output means, and
the power source voltage detection means controlling the slew rate of the output of the output slew rate changing means in accordance with a change in the power source voltage.

11. A photoreceptor comprising:
a photodiode for receiving an optical signal and converting the optical signal into an electric signal;
an output circuit for outputting a digital signal in accordance with the electric signal; and
an erroneous operation detection circuit for monitoring the digital signal outputted from the output means, and detecting erroneous operation,
the output circuit including an output slew rate changing element for changing a slew rate of output of the output circuit, and
the erroneous operation detection circuit performing, when the erroneous operation detection circuit detects the erroneous operation, such control that the slew rate of the output of the slew rate changing element is decreased.

12. The photoreceptor as set forth in claim 11, wherein:
the erroneous operation detection circuit includes:
an edge detection circuit for detecting an edge included in the digital signal outputted from the output circuit;
an edge counting circuit for, counting a number of edges the edge detection circuit detects per unit time;
an edge number comparing circuit for comparing, with a predetermined number, the number of the edges the edge count circuit counted, and for judging that the erroneous operation occurs, when the number of the edges thus counted is equal or greater than the predetermined number.

* * * * *